(12) United States Patent
Wang et al.

(10) Patent No.: US 10,511,275 B2
(45) Date of Patent: Dec. 17, 2019

(54) COMMON MODE SENSING ARCHITECTURE

(71) Applicant: Microchip Technology Incorporated, Chandler, AZ (US)

(72) Inventors: Dong Wang, Chandler, AZ (US); Jim Nolan, Chandler, AZ (US); Kumen Blake, Gilbert, AZ (US); Milan Rai, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 15/940,709

(22) Filed: Mar. 29, 2018

(65) Prior Publication Data

US 2019/0222185 A1 Jul. 18, 2019

Related U.S. Application Data

(60) Provisional application No. 62/617,760, filed on Jan. 16, 2018.

(51) Int. Cl.
*H03F 3/45* (2006.01)
*H01B 11/10* (2006.01)
*H03F 1/14* (2006.01)

(52) U.S. Cl.
CPC ......... *H03F 3/45479* (2013.01); *H01B 11/10* (2013.01); *H03F 1/14* (2013.01); *H03F 3/45197* (2013.01); *H03F 3/45206* (2013.01); *H03F 3/45475* (2013.01); *H03F 3/45632* (2013.01); *H03F 3/45928* (2013.01); *H03F 2200/261* (2013.01); *H03F 2203/45008* (2013.01); *H03F 2203/45418* (2013.01); *H03F 2203/45432* (2013.01)

(58) Field of Classification Search
CPC .................................................. H03F 3/45479
See application file for complete search history.

(56) References Cited

U.S. PATENT DOCUMENTS

| | | | | |
|---|---|---|---|---|
| 4,575,685 A | * | 3/1986 | Dobkin | H03F 3/45479 330/257 |
| 5,917,383 A | | 6/1999 | Tso et al. | 331/57 |
| 5,936,469 A | * | 8/1999 | Alexander | H03F 3/45183 330/253 |
| 2005/0046481 A1 | | 3/2005 | Van Engelen et al. | 330/259 |
| 2006/0132239 A1 | * | 6/2006 | Kelly | G05F 3/262 330/257 |
| 2011/0115561 A1 | * | 5/2011 | Kumar | H03F 1/0266 330/253 |
| 2011/0181361 A1 | | 7/2011 | Nolan et al. | 330/278 |

OTHER PUBLICATIONS

International Search Report and Written Opinion, Application No. PCT/US2019/013573, 15 pages, dated Apr. 15, 2019.

* cited by examiner

*Primary Examiner* — Patricia T Nguyen
(74) *Attorney, Agent, or Firm* — Slayden Grubert Beard PLLC

(57) ABSTRACT

An amplifier includes a differential positive input, a differential negative input, and a transistor. The transistor is communicatively coupled to the differential positive input and differential negative input at a source of the transistor. The transistor is configured to track input common mode of the differential positive input and differential negative input.

20 Claims, 5 Drawing Sheets

US 10,511,275 B2

COMMON MODE SENSING ARCHITECTURE

PRIORITY APPLICATION

The present application claims priority to U.S. Provisional Application No. 62/617,760 filed Jan. 16, 2018, the contents of which are hereby incorporated in their entirety.

FIELD OF THE INVENTION

The present disclosure relates to instrumentation amplifiers and, more particularly, to a common mode sensing architecture and technique for instrumentation amplifiers.

BACKGROUND

Instrumentation amplifiers may be used in variety of industrial applications. An instrumentation amplifier may include a differential amplifier. A differential amplifier is a type of electronic amplifier that amplifies the difference between two input voltages but suppresses any voltage common to the two inputs. A differential amplifier may be an analog circuit with two inputs and one output in which the output is ideally proportional to the difference between the two voltages. An instrumentation amplifier may include a differential amplifier that includes input buffer amplifiers. These may reduce or eliminate the need for input impedance matching. Thus, the amplifier may be more suited for use in measurement and test equipment.

In many sensor applications, due to a complicated operating environment, a weak sensor output signal may be amplified. However, at the same time strong common mode signal variations like power line noise are to be rejected. An instrumentation amplifier may be configured to provide differential gains and high common mode rejection.

The common mode rejection ratio of an instrumentation amplifier is defined as input common mode signal variation divided by output signal variation over frequency. Poor common-mode rejection ratio can be caused by mismatch in resistor ratios and by mismatch in common mode gains of input op-amps. A classical architecture of instrumentation amplifier is to use three amplifiers with resistor feedback network.

The ideal common-mode gain of an instrumentation amplifier is zero. Common-mode gain can be caused by mismatch in resistor ratios and by mismatch in common mode gains of input op-amps. Instrumentation amplifiers can be built with individual op-amps and precision resistors, but are also available in integrated circuit form.

SUMMARY

Embodiments of the present disclosure include a common mode sensing amplifier. The amplifier includes a differential positive input, a differential negative input, and a first transistor. The first transistor is communicatively coupled to the differential positive input and differential negative input at a source of the transistor. The transistor is configured to track input common mode of the differential positive input and differential negative input. In combination with any of the above embodiments, a first end of a resistive network in the amplifier is configured to receive input from the differential positive input and a second end of the resistive network is configured to receive input from the differential negative input. In combination with any of the above embodiments, the first transistor is coupled to the resistive network at a source of the transistor. In combination with any of the above embodiments, the first transistor is configured to generate a common mode output corresponding to the input common mode of the differential positive input and differential negative input. In combination with any of the above embodiments, the common mode output is a bias current. In combination with any of the above embodiments, the amplifier further includes cross-coupled current sources. In combination with any of the above embodiments, the cross-coupled current sources are configured to match current differential between the differential positive input and differential negative input. In combination with any of the above embodiments, output voltage of the first transistor is equal to an average of voltages of the differential positive input and differential negative input. In combination with any of the above embodiments, the amplifier includes a second transistor including a gate driven by the differential positive input and communicatively coupled to the first transistor. In combination with any of the above embodiments, the amplifier includes a third transistor including a gate driven by the differential negative input and communicatively coupled to the first transistor.

Embodiments of the present disclosure include a system. The system includes an instrumentation amplifier, a common mode output, a differential positive input, and a differential negative input. The instrumentation amplifier may include any of the common mode sensing amplifiers above. In combination with any of the above embodiments, the instrumentation amplifier may receive signals from a signal source, wherein the signal source is a shielded cable and the common mode output is configured to improve common mode rejection due to mismatched impedance of the shielded cable.

Embodiments of the present disclosure may include methods performed by any of the amplifiers or systems from above.

DETAILED DESCRIPTION

Figure 1:
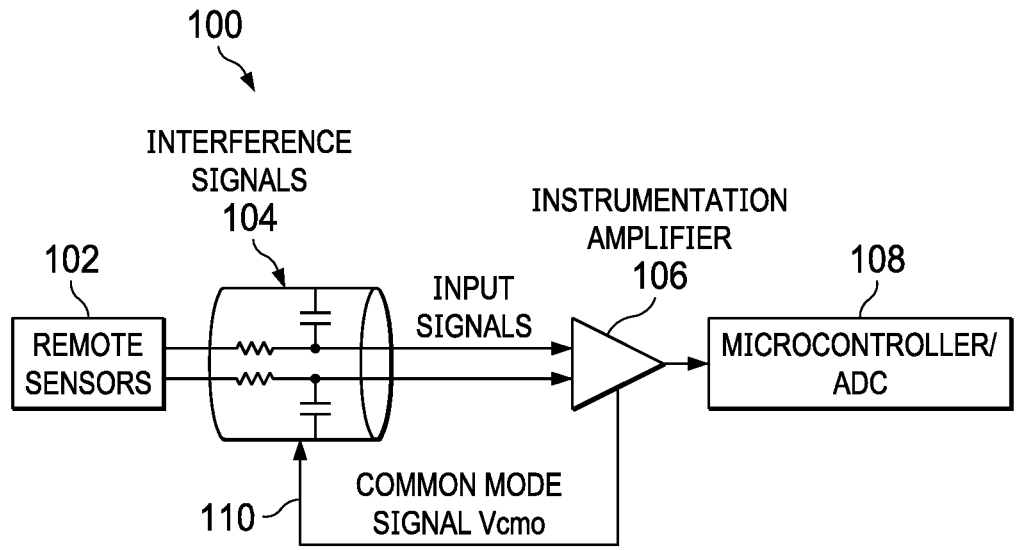
FIG. 1 is an illustration of a system using an instrumentation amplifier, according to embodiments of the present disclosure.

FIG. 1 is an illustration of a system 100 using an instrumentation amplifier, according to embodiments of the present disclosure.

System 100 may include one or more remote sensors 102. Remote sensors 102 may include any suitable sensor that is configured to generate an analog signal representative of measurements to be taken using remote sensors 102. Remote sensors 102 may generate such a signal that is to be received and used by a suitable entity. Such an entity may include a microcontroller 108, analog-to-digital converter (ADC), processor, application specific integrated circuit (ASIC), field programmable gate array (FPGA), integrated circuit, system on a chip (SoC), or any other suitable electronic device.

Remote sensors 102 may be considered remote in that remote sensors 102 may be implemented outside of microcontroller 108. Remote sensors 102 may operate at a remote location from the signal conditioning circuits of system 100. The signal generated by remote sensors 102 may be prone to various interference and interference signals. The interference may interact with signals generated by remote sensors 102 in a cable connecting remote sensors 102 to microcontroller 108. Accordingly, a shielded cable 104 may be used to counteract such interference used. Shielded cable 104 and any interference may have capacitive and resistive effects.

In one embodiment, system 100 may include an instrumentation amplifier 106. Instrumentation amplifier 106 may be configured to remove noise from interference signals 104 from the signals received at instrumentation amplifier 106. Instrumentation amplifier 106 may be configured to pass signals without such interference to microcontroller 108.

In one embodiment, instrumentation amplifier 106 may be configured to generate a bias signal 110. Bias signal 110 may be based upon a determination of the common mode signal (Vcmo) carried to instrumentation amplifier 106. In a further embodiment, bias signal 110 may be implemented as a bias current. In another, further embodiment, bias signal 110 may be implemented as a bias voltage.

Instrumentation amplifier 106 may include a common mode amplifier to generate bias signal 110 to bias shielded cable 104. The result may be a removal or reduction of cross-talk and other effects of parasitic capacitances of shielded cable 104. By removing cross-talk and other effects of parasitic capacitances of shielded cable 104 or other portions of system 100, the common mode rejection of system may be improved. Input common mode voltage may also be used for error detection applications if, for example, input signals are out of range.

Figure 2:
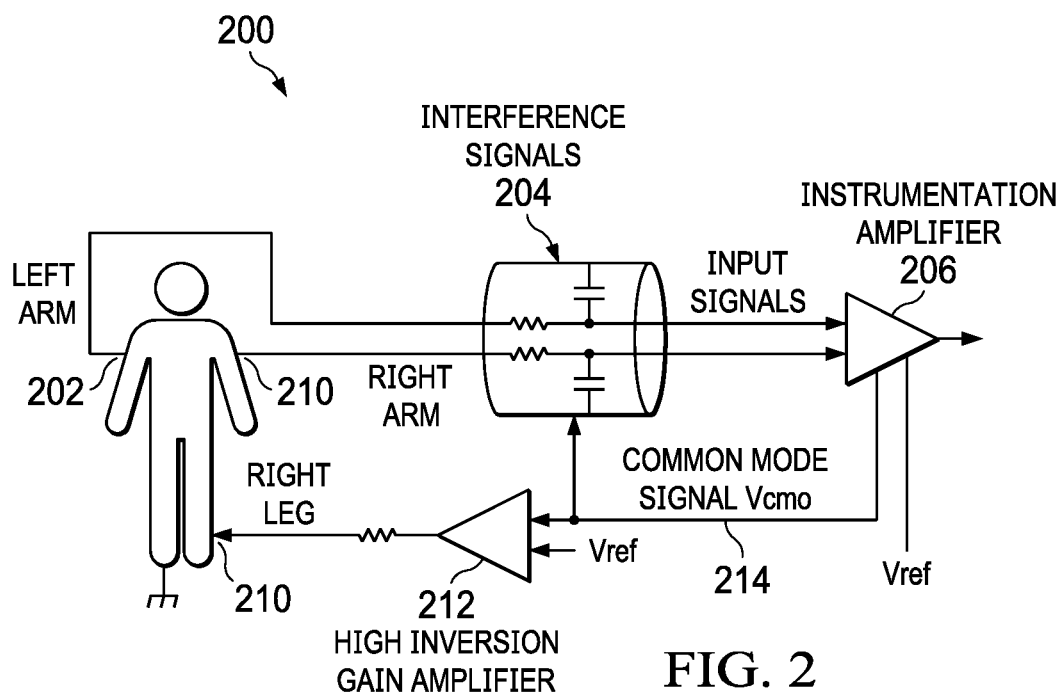
FIG. 2 is an illustration of another system using an instrumentation amplifier, according to embodiments of the present disclosure.

FIG. 2 is an illustration of another system 200 using an instrumentation amplifier, according to embodiments of the present disclosure. System 200 illustrates further example uses of instrumentation amplifiers implemented according to teachings of the present disclosure. System 200 may illustrate an example electrocardiogram (ECG) application. System 200 may include an instrumentation amplifier 206, implemented in a similar manner as instrumentation amplifier 106.

Instrumentation amplifier 206 may receive signals generated by remote sensors or other connection points 202, 210 as attached to a person's left arm and right arm. Furthermore, a sensor or connection 210 may be attached to the person's right leg. This sensor arrangement is presented as an example arrangement for ECG applications, although any suitable arrangement may be used. A shielded cable 204 may be used to transport signals to or from instrumentation amplifier 206. Instrumentation amplifier 206 may be configured to provide its resulting signals to a microprocessor, ADC, or other suitable destination (not shown).

During measurement, interference signals may occur. Such signals may include a power supply noise at, for example, 60 Hz. The interference signals may include a parasitic mismatch of shielded cable 204. The mismatch of shielded cable 204 may have an effect of reducing common mode rejection to 60 dB when operating at 60 Hz.

In one embodiment, instrumentation amplifier 206 may be configured to generate a common mode signal 214. Common mode signal 214 may be a current or a voltage, and may be based upon a common mode signal determined in instrumentation amplifier 206. Similar to the example in FIG. 1, common mode signal 214 may be configured to be applied to shielded cable 204. Furthermore, in one embodiment common mode signal 214 may be applied to sensors on the person. For example, common mode signal 214 may be input into a high inversion gain amplifier 212 along with a same voltage reference used by instrumentation amplifier 206. The result may be applied to connection point 212 at the right leg of the person. By applying the common mode voltage from high inversion gain amplifier 212 to the body of the patient and shielded cable 204, common mode rejection may be improved significantly, yielding higher measurement accuracy.

Figure 3:
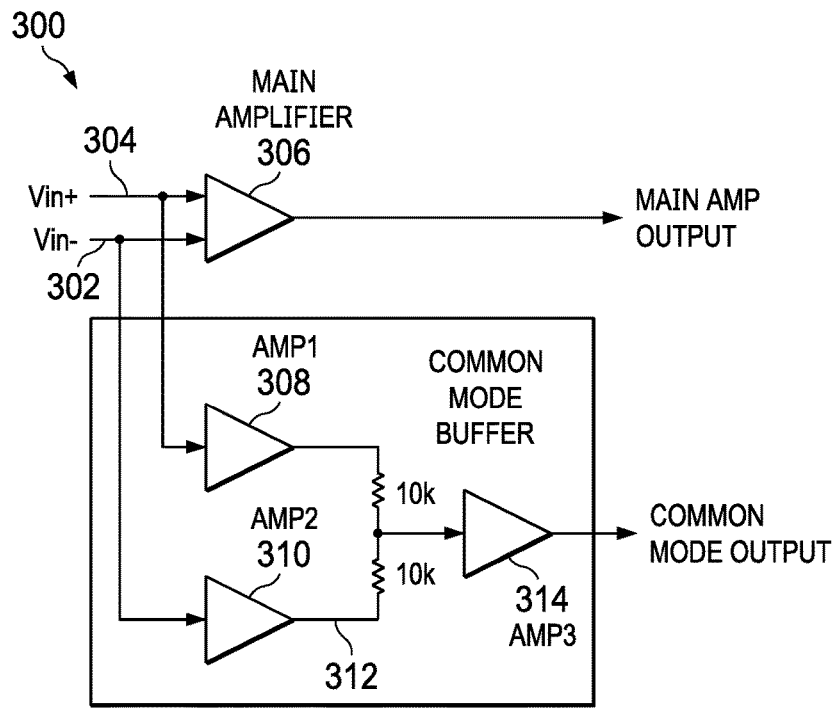
FIG. 3 is an illustration of an example instrumentation amplifier used by other solutions.

FIG. 3 is an illustration of an example instrumentation amplifier 300 used by other solutions. Instrumentation amplifier 300 may include a positive input voltage 304 and a negative input voltage 302 to receive signals from a sensor. Voltages 304, 302 may be passed to a main amplifier 306 configured to produce a main amplifier output for instrumentation amplifier 300. Voltages 304, 302 may also be passed to a common mode buffer configured to generate a common mode output. The common mode buffer may include three extra amplifiers, Amp1 308, Amp2 310, Amp3 314. Amp1 308 and Amp2 310 may be in parallel with each other and configured to receive a respective one of voltages 304, 302. The outputs of Amp1 308 and Amp2 310 may be connected through a resistive network 312 and connected to input of Amp3 314. Resistive network 312 may include two 10-kiloohm resistors, each in series with an output of a respective one of Amp1 308 and Amp2 310. Outputs from the resistors may be joined to input of Amp3 314. Output of Amp3 314 may be the common mode output of instrumentation amplifier 300.

Amplifiers Amp1 308, Amp2 310, Amp3 314 may degrade the input noise specification of main amplifier 306. The noise may be referred back to input. Thus, common mode output may be generated, and the common-mode may be compensated for. However, an implementation as shown in FIG. 3 incurs a high power consumption and a high die-area penalty due to having three extra amplifiers. Furthermore, this solution might not be accurate.

Figure 4:
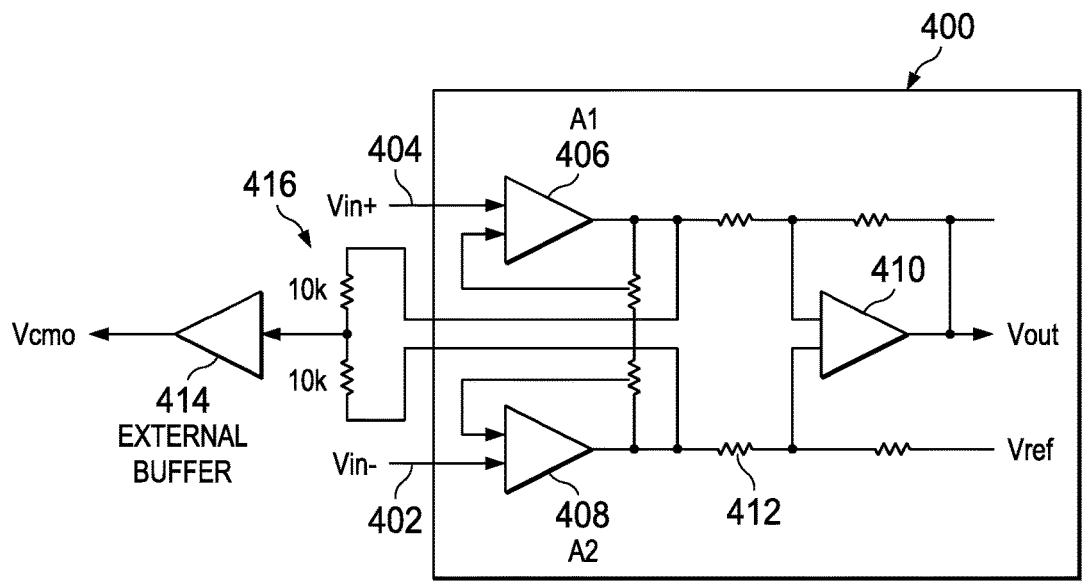
FIG. 4 is an illustration of another example instrumentation amplifier used by other solutions.

FIG. 4 is an illustration of another example instrumentation amplifier 400 used by other solutions. Instrumentation amplifier 400 may include three operational amplifiers 406, 408, 410 connected to each other through a resistive network 412. A positive input voltage 404 and a negative input voltage 402 from sensor signals may be connected to respective operational amplifiers 406, 408. Other inputs of operational amplifiers 406, 408 may be connected to the output of each other through resistive network 412. Outputs of operational amplifiers 406, 408 may be connected through resistive network 412 to inputs of operational amplifier 410. The output of operational amplifier 410 may be the output voltage of instrumentation amplifier 400. Output of operational amplifier 408 may be connected to an output corresponding to a voltage reference.

Furthermore, outputs of operational amplifiers 406, 408 may be connected through resistive network 412 to another resistive network 416. Resistive network 416 may include two 10-kiloohm resistors connected in parallel, the output of which may be connected to an external buffer 414. Output of external buffer 414 may be the common mode voltage.

External buffer 414 may be external to a package or integrated circuit including instrumentation amplifier 400.

Thus, instrumentational amplifier 400 may perform common mode voltage sensing through components external to instrumentation amplifier, such as external buffer 414 and resistive network 416. These external components may be selected, used, and tailored to a particular application. The architecture shown in FIG. 4 may be referred to as an INA architecture. However, this solution may be unacceptable for use with low-power supplies and signals, and may require extra external components.

Figure 5:
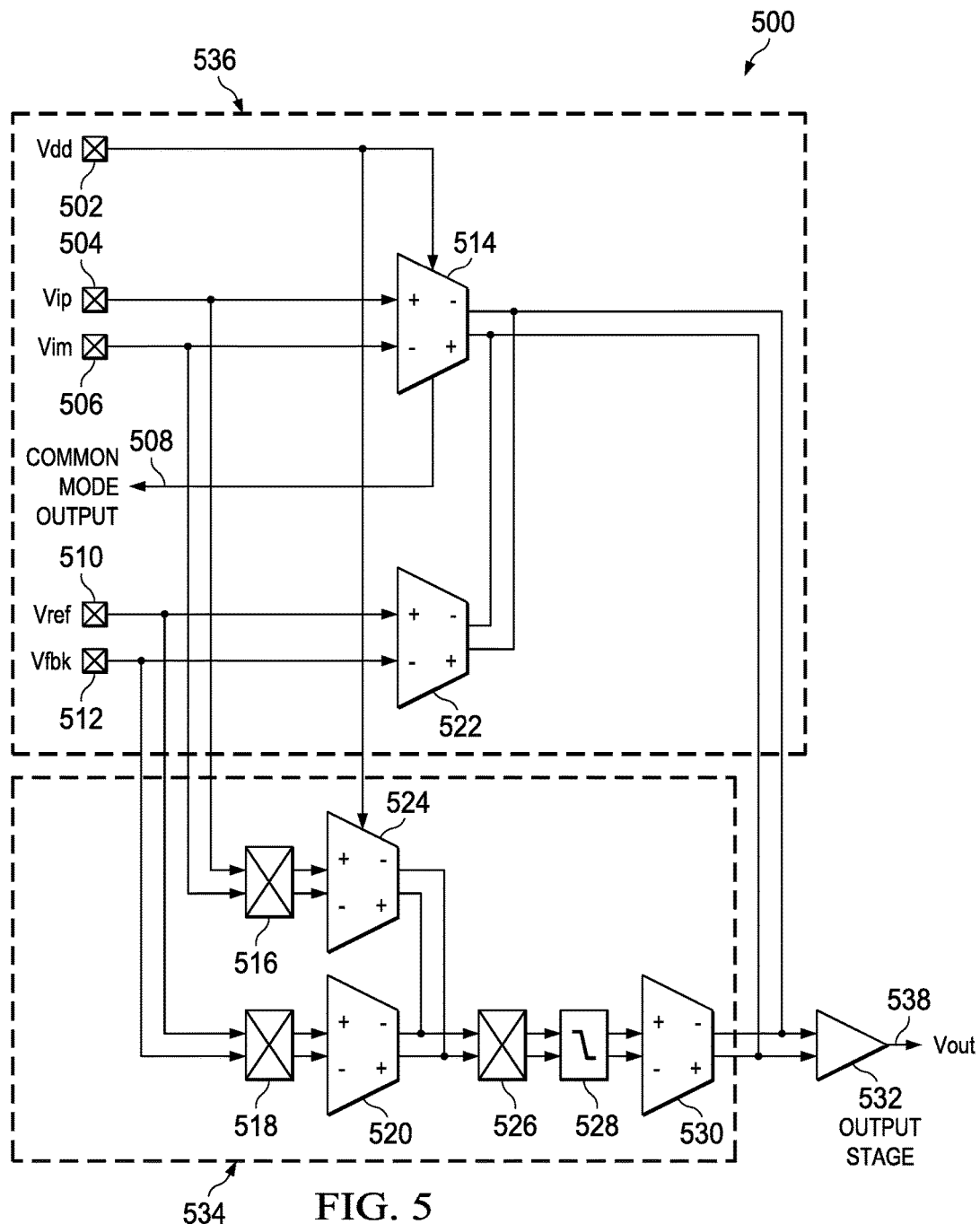
FIG. 5 is an illustration of an instrumentation amplifier, according to embodiments of the present disclosure.

FIG. 5 is an illustration of an instrumentation amplifier 500, according to embodiments of the present disclosure. Instrumentation amplifier 500 may illustrate an example implementation of instrumentation amplifiers 106, 206. Instrumentation amplifier 500 may be implemented as an in-direct current feedback instrumentation amplifier.

Instrumentation amplifier 500 may include a main path 536 and a chopped path 534. The use of distinct paths 534, 536 may both reduce offset and achieve high bandwidth.

Instrumentation amplifier 500 may include any suitable number and kind of inputs. For example, instrumentation amplifier 500 may include a Vdd input 502 configured to provide operational voltage to the components of instrumentation amplifier 500. Instrumentation amplifier 500 may include a positive input voltage (Vip) 504 and a negative input voltage (Vim) 502. Input voltages 502, 504 may be received from sensors. Instrumentation amplifier 500 may include a voltage reference (Vref) input 510 and a voltage feedback (Vfbk) input 512. Vref may be provided by a end user application system in which instrumentation amplifier 500 is implemented. Vfbk may be provided by a resistor divider. Such a resistor divider may be provided on-chip or off-chip.

Instrumentation amplifier 500 may be configured to produce an output voltage 538 representing the voltage of the received signals from the sensors. In one embodiment, instrumentation amplifier 500 may be configured to produce a common mode output 508. Common mode output 508 may be used as, for example, a bias signal.

To generate output voltage 538, main path 536 and chopped path 534 may each be configured to generate a constituent current. The current may be provided to an output stage amplifier 532. Output stage amplifier 532 may be configured to convert the constituent currents to voltage. In one embodiment, chopped path 534 may be configured to improve common mode rejection from the output of main path 536.

Main path 536 may be implemented with an amplifier 514 and an amplifier 522. Chopped path 534 may be implemented with one or more amplifiers 520, 524, 530; switches 516, 518, 526; and filter 528. Amplifiers 514, 520, 522, 524, 530 may be implemented fully or in-part by operational transconductance amplifiers (OTA). Amplifiers 514, 520, 522, 524, 530 may be configured to convert a differential input voltage into a corresponding current. Amplifiers 514, 520, 522, 524, 530 may include positive and negative current outputs. Main path 536 may be implemented as a fast signal path to the inputs to achieve a high bandwidth. Chopped path 534 may utilize chopping techniques combined with switched capacitor filters and high gain to achieve an ultra-low offset.

In one embodiment, amplifier 514 may be configured to generate common mode output 508 for instrumentation amplifier 500. Amplifier 514 may be configured to generate such common mode output 508 based upon voltage inputs 504, 506.

Figure 6:
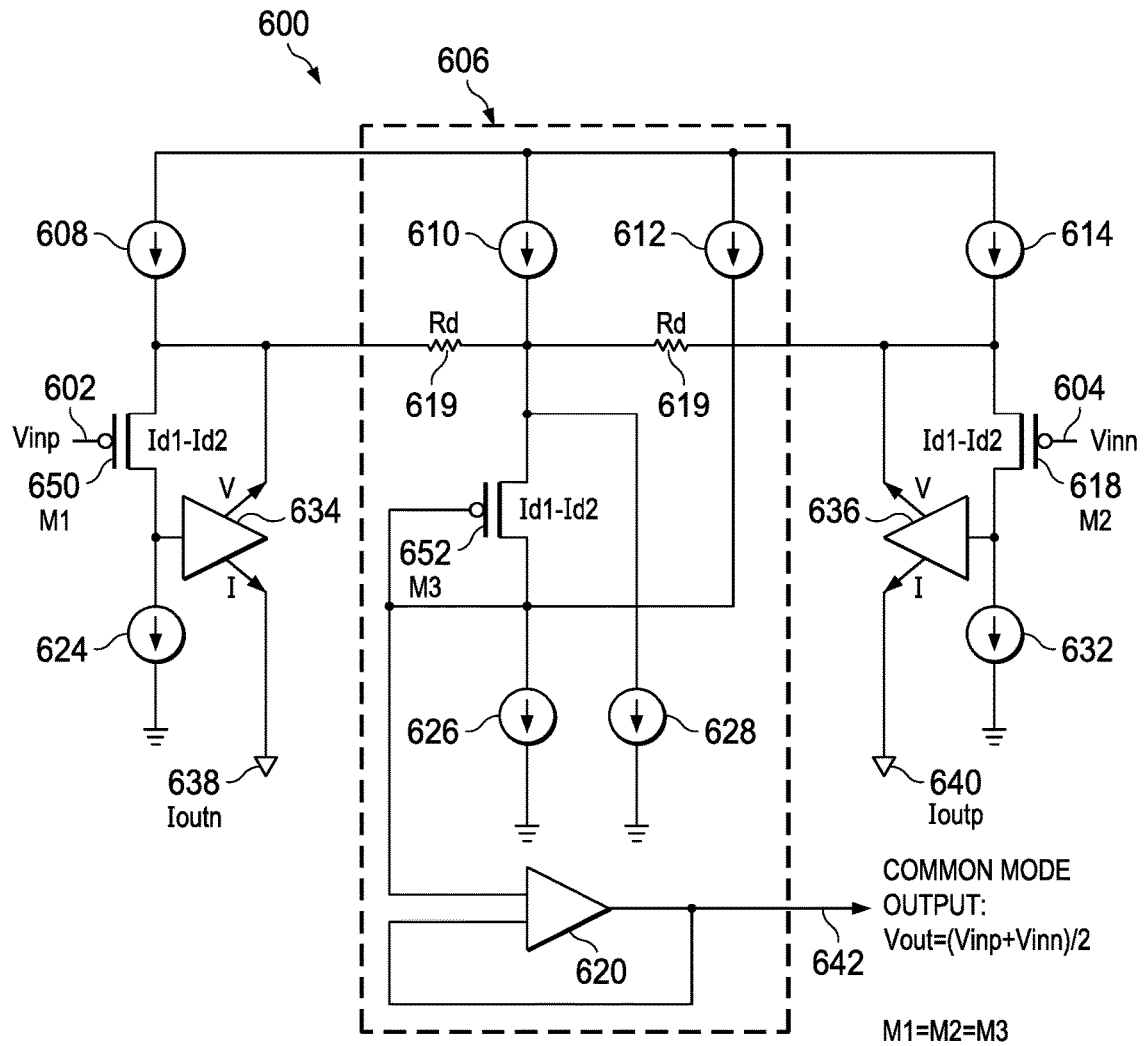
FIG. 6 is an illustration of a transconductance amplifier, according to embodiments of the present disclosure.

FIG. 6 is an illustration of a transconductance amplifier 600, according to embodiments of the present disclosure. Transconductance amplifier 600 may implement amplifier 514 of FIG. 5. Instrumentation amplifier In one embodiment, transconductance amplifier 600 may include a common mode amplifier 606. Other portions of transconductance amplifier 600 may be configured to convert voltage differential to output positive and negative currents. Common mode amplifier 606 may be configured to generate a common mode output 642 that may be used as a bias signal.

Transconductance amplifier 600 may include positive voltage input (Vinp) 602 and a negative voltage input (604). Each of voltage inputs 602, 604 may be connected to the gate of a respective device M1 650, M2 618. These may be implemented by one or more transistors. In the example of FIG. 6, the transistors may be implemented by a diode-connected p-channel metal-oxide-semiconductor (PMOS) transistor. In various embodiments, the transistors may be implemented instead by n-channel metal-oxide-semiconductor (NMOS) transistors, bipolar junction transistors (BJT), or junction gate field-effect transistors (JFET).

Transconductance amplifier 600 may include current sources 608, 614. Each may have a current value of Id2. Current sources 608, 614 may be connected to the sources of respective ones of devices 650, 618. The sources of devices 650, 618 may be connected to each other through a resistive network 619. Resistive network 619 may include two matching resistors, Rd. Transconductance amplifier 600 may further include current sources 624, 632. Each of these current sources may have a current, Id1. Current sources 624, 632 may be connected to the drains of respective ones of devices M1 650, M2 618. Devices 650, 618 may be implemented by one or more transistors. The current flowing through devices M1 650 and M2 618 may both be equal to the quantity (Id1−Id2).

Transconductance amplifier 600 may include amplifiers 634, 640. Amplifiers 634, 640 may be configured to perform as level shifters and buffers. Amplifiers 634, 640 may be configured to produce an amplified voltage and current. Amplifiers 634, 640 may receive their inputs from the drain of respective ones of devices 650, 618. Amplifiers 634, 640 may apply voltage outputs to the source of respective ones of devices 650, 618. Current output of amplifier 634 may be the negative current output of transconductance amplifier 600. Current output of amplifier 636 may be the positive current output of transconductance amplifier 600.

In one embodiment, transconductance amplifier 600 may include a third device M3 652 in common mode amplifier 606. Device 652 may be implemented by one or more transistors. Device 652 may be configured to track the input common mode on voltage inputs 602, 604. Tracking the input common mode may include that the output of M3 device 652 on its drain and gate are equal to the common mode of the voltage inputs. Current sources 610, 626 may be set to Id1. Current sources 612, 628 may be set to Id2. As a result, current flowing through M3 device 652 may be of the quantity (Id1−Id2). This may be the same as the current flowing through M1 and M2. The dimensions of device M3 may be equal to that of M1 and M2. Since the current flowing through M3 is the same as those of M1 and M2, and value of the two resistors R1 and R2 are the same, the drain voltage of M3 is equal to the input common mode voltage—((Vinp+Vinn)/2).

In one embodiment, common mode amplifier 606 may include four additional current sources 610, 612, 626, 628. Current sources 610, 612, 626, 628 may cross-coupled.

Current source 610 may be given as Id1. Current source 612 may be given as Id2. Current source 626 may be given as Id1. Current source 628 may be given as Id2. Current source 610 may be connected to a node in the middle of the resistors of resistive network 619, which is also the source of device 652. The node may be connected to the source of device 652. Current source 612 may be connected to the drain of device 652. Furthermore, current source 612 may be connected to a drain of device 652. Current source 626 may be connected to a drain of device 652. Current source 628 may be connected to the source of device 652.

In one embodiment, common mode amplifier 606 may include an operational amplifier 620. Operational amplifier 620 may accept as inputs a feedback from its own output and a connection to the gate of device 652. Output of common mode amplifier 606 may be common mode output 642 of transconductance amplifier 600.

In one embodiment, common mode amplifier 606 may be configured to measure the input common mode voltage arising from voltage inputs 602, 604 accurately. The measurement may be made with very low current and very small noise penalty. The current flowing through device 652 may match the input differential pair currents. In various embodiments, the three devices 650, 652, 618 may have the same device sizes and implemented in the same manner. Common mode output 642 may equal ((Vinn+Vinp)/2).

Transconductance amplifier 600 may use a minimal amount of circuitry with low power and noise, yet may accurately extract the common mode voltage from the input differential signals. Transconductance amplifier 600 may fit inside in-direct current feedback architectures with its compact layout area. Transconductance amplifier 600 may incur a minimal noise penalty and require low power consumption. There may be no need for external common mode amplifiers or extra components.

Figure 7:
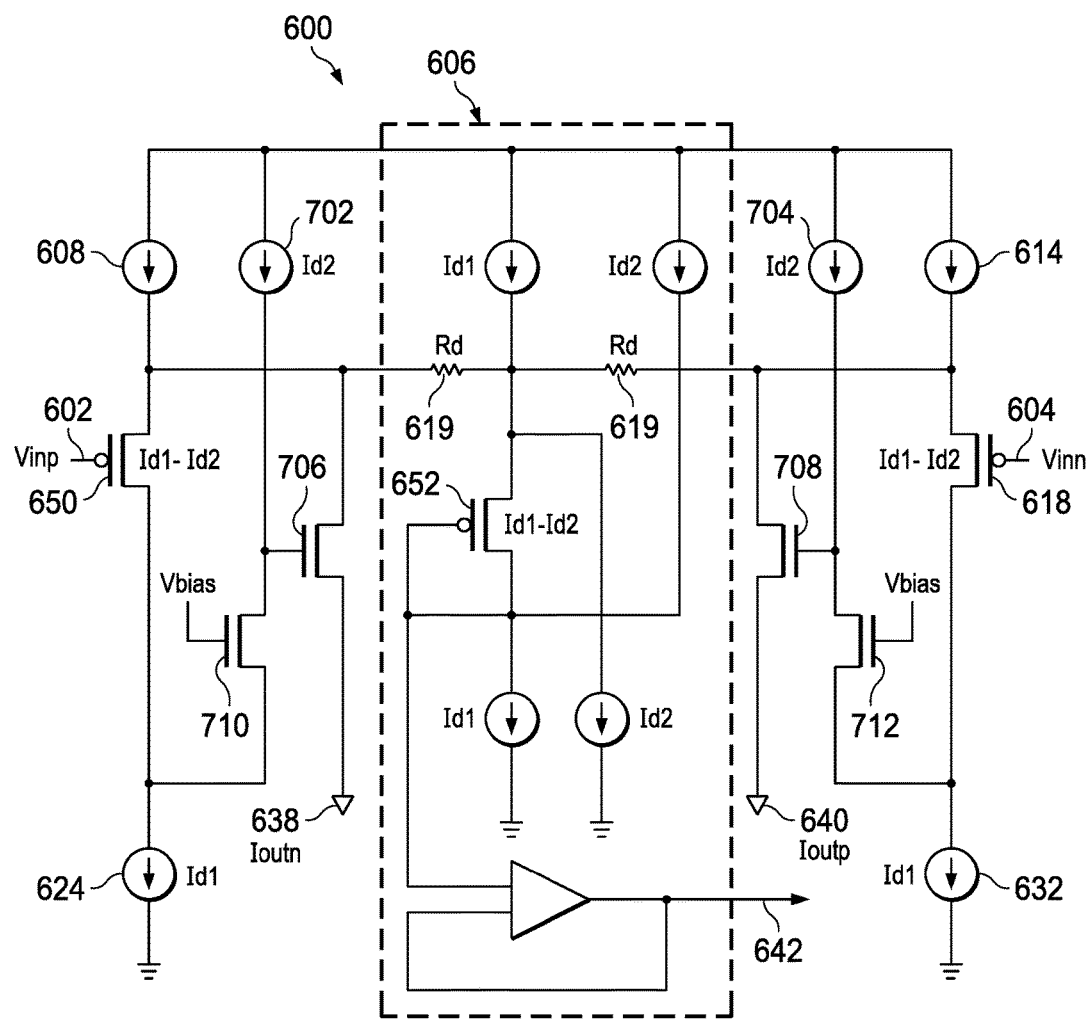
FIG. 7 is a more detailed illustration of a transconductance amplifier, according to embodiments of the present disclosure.

FIG. 7 is a more detailed illustration of an instrumentation sensing amplifier, according to embodiments of the present disclosure. FIG. 7 may illustrate more particular implementations of buffer and level shifters of transconductance amplifier 600. In particular, FIG. 7 illustrates implementations of the buffer and level shifters using devices such as NMOS transistors.

Transconductance amplifier 600 may include current source 702, given as Id2. Transconductance amplifier 600 may include current source 704, given as Id2. Transconductance amplifier 600 may include devices 706, 708, 710, 712. Devices 706, 708, 710, 712 may be implemented by one or more transistors.

Current source 702 may be connected to a gate of device 706 and a source of device 710. Current source 704 may be connected to the gate of device 708 and the source of device 712. The source of device 706 may be connected to resistive network 619 and to current source 608. The source of device 708 may be connected to the other side of resistive network 619 and to current source 614. The drain of device 710 may be connected to current source 624. The drain of device 712 may be connected to current source 632. The drain of device 706 may be negative output current 638 of transconductance amplifier 600. The drain of device 708 may be positive output current 640 of transconductance amplifier 600. Gates of devices 710, 712 may be connected to a Vbias input.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

The invention claimed is:

1. A common mode sensing amplifier, comprising:
   a differential positive input;
   a differential negative input;
   a first transistor, wherein:
      the first transistor is communicatively coupled to the differential positive input and differential negative input at a source of the first transistor; and
      the first transistor is configured to track input common mode of the differential positive input and differential negative input; and
   a resistive network, wherein:
      a first end of the resistive network is configured to receive input from the differential positive input and a second end of the resistive network is configured to receive input from the differential negative input; and
      the first transistor is coupled to the resistive network at a source of the first transistor.

2. The common mode sensing amplifier of claim 1, wherein the first transistor is configured to generate a common mode output corresponding to the input common mode of the differential positive input and differential negative input.

3. The common mode sensing amplifier of claim 2, wherein the common mode output is a bias current.

4. The common mode sensing amplifier of claim 1, further comprising a plurality of cross-coupled current sources.

5. A common mode sensing amplifier, comprising:
   a differential positive input;
   a differential negative input;
   a first transistor, wherein:
      the first transistor is communicatively coupled to the differential positive input and differential negative input at a source of the first transistor; and
      the first transistor is configured to track input common mode of the differential positive input and differential negative input; and
   a plurality of cross-coupled current sources, wherein the cross-coupled current sources are configured to match current differential between the differential positive input and differential negative input.

6. The common mode sensing amplifier of claim 1, wherein output voltage of the first transistor is equal to an average of voltages of the differential positive input and differential negative input.

7. The common mode sensing amplifier of claim 1, further comprising:
   a second transistor including a gate driven by the differential positive input and communicatively coupled to the first transistor; and
   a third transistor including a gate driven by the differential negative input and communicatively coupled to the first transistor.

8. A system, comprising:
   a resistive network;
   an instrumentation amplifier;
   a common mode output;
   a differential positive input; and
   a differential negative input;
   wherein:

the differential positive input and the differential negative input are configured to receive a sensor signal;

the instrumentation amplifier includes a transconductance amplifier, the transconductance amplifier including a first transistor;

the first transistor is communicatively coupled to the differential positive input and differential negative input at a source of the first transistor;

the first transistor is configured to track input common mode of the differential positive input and differential negative input;

the instrumentation amplifier is configured to generate a bias signal from the input common mode on the common mode output for a signal source connected to the differential positive input and differential negative input;

a first end of the resistive network is configured to receive input from the differential positive input and a second end of the resistive network is configured to receive input from the differential negative input; and the first transistor is coupled to the resistive network at a source of the first transistor.

9. The system of claim 8, wherein the signal source is a shielded cable and the common mode output is configured to improve common mode rejection due to mismatched impedance of the shielded cable.

10. The system of claim 8, wherein the first transistor is configured to generate the common mode output corresponding to the input common mode of the differential positive input and differential negative input.

11. The system of claim 10, wherein the common mode output is a bias current.

12. The system of claim 8, wherein the transconductance amplifier further comprises a plurality of cross-coupled current sources.

13. A system, comprising:
an instrumentation amplifier including a plurality of cross-coupled current sources;
a common mode output;
a differential positive input; and
a differential negative input;
wherein:
the differential positive input and the differential negative input are configured to receive a sensor signal;
the instrumentation amplifier includes a transconductance amplifier, the transconductance amplifier including a first transistor;
the first transistor is communicatively coupled to the differential positive input and differential negative input at a source of the first transistor;
the first transistor is configured to track input common mode of the differential positive input and differential negative input;
the instrumentation amplifier is configured to generate a bias signal from the input common mode on the common mode output for a signal source connected to the differential positive input and differential negative input; and the cross-coupled current sources are configured to match current differential between the differential positive input and differential negative input.

14. The system of claim 8, wherein output voltage of the first transistor is equal to an average of voltages of the differential positive input and differential negative input.

15. The system of claim 8, wherein the transconductance amplifier further comprises:
a second transistor including a gate driven by the differential positive input and communicatively coupled to the first transistor; and
a third transistor including a gate driven by the differential negative input and communicatively coupled to the first transistor.

16. A method, comprising:
receiving, at a transconductance amplifier, a differential positive input;
receiving, at the transconductance amplifier, a differential negative input, wherein the differential positive input and differential negative input make up a sensor signal;
tracking, by a first transistor of the transconductance amplifier, input common mode of the differential positive input and differential negative input;
generating a bias signal from the input common mode on the common mode output for a signal source of the sensor signal;
receiving input from the differential positive input at a first end of a resistive network
receiving input from the differential negative input at a second end of the resistive network; and
applying output from the resistive network to a source of the first transistor.

17. The method of claim 16, further comprising applying the bias signal to a shielded cable with mismatched impedance.

18. The method of claim 16, further comprising generating the common mode output based on input common mode of the differential positive input and differential negative input.

19. The method of claim 16, further comprising:
matching a current differential between the differential positive input and differential negative input; and
using the current differential to track the input common mode of the differential positive input and differential negative input.

20. A method, comprising:
receiving, at a transconductance amplifier, a differential positive input;
receiving, at the transconductance amplifier, a differential negative input, wherein the differential positive input and differential negative input make up a sensor signal;
tracking, by a first transistor of the transconductance amplifier, input common mode of the differential positive input and differential negative input;
generating a bias signal from the input common mode on the common mode output for a signal source of the sensor signal; and
using a plurality of cross-coupled current sources to match current differential between the differential positive input and differential negative input.

* * * * *